United States Patent [19]

Ohtsuka et al.

[11] Patent Number: 5,229,963
[45] Date of Patent: Jul. 20, 1993

[54] SEMICONDUCTOR NONVOLATILE MEMORY DEVICE FOR CONTROLLING THE POTENTIALS ON BIT LINES

[75] Inventors: Nobuaki Ohtsuka, Yokohama; Sumio Tanaka, Oomorinishi; Junichi Miyamoto, Yokohama; Shigeru Atsumi, Tokyo, all of Japan

[73] Assignee: Kabushiki Kaisha Toshiba, Kawasaki, Japan

[21] Appl. No.: 740,665

[22] Filed: Aug. 2, 1991

Related U.S. Application Data

[63] Continuation of Ser. No. 409,307, Sep. 19, 1989, abandoned.

[30] Foreign Application Priority Data

Sep. 21, 1988 [JP] Japan .................. 63-236869

[51] Int. Cl.⁵ .................................. G11C 11/34
[52] U.S. Cl. .................. 365/185; 365/189.09; 365/189.11; 365/226
[58] Field of Search .......... 365/185, 226, 189.09, 365/189.11

[56] References Cited

U.S. PATENT DOCUMENTS

| | | | |
|---|---|---|---|
| 4,527,256 | 7/1985 | Giebel | 365/185 |
| 5,105,386 | 4/1992 | Andoh et al. | 365/230.06 |
| 5,138,579 | 8/1992 | Tatsumi et al. | 365/189.09 |

FOREIGN PATENT DOCUMENTS 63-86195 4/1988 Japan.
63-86196 4/1988 Japan.

Primary Examiner—Joseph E. Clawson, Jr.
Attorney, Agent, or Firm—Finnegan, Henderson, Farabow, Garrett & Dunner

[57] ABSTRACT

A nonvolatile semiconductor memory device comprising a power source terminal and a P-channel MOS transistor. A low power-source voltage is applied to the terminal during a read period. The source of the P-channel MOS transistor is coupled to the power source terminal. The conduction of the MOS transistor is controlled by data-writing operation. The drain of the MOS transistor is connected by a node to a plurality of bit lines. The device further comprises a plurality of memory cells and a plurality of N-channel MOS transistor. The memory cells have double-gate structure, each having a source coupled to the ground and a drain coupled to the corresponding bit line. Each N-channel MOS transistor has a source and a drain connected to the ground and the corresponding bit line, respectively, for discharging the bit line. Each N-channel MOS transistor is rendered conductive temporarily when the supply of the high power source voltage to the power source terminal is started, whereby the potential of the corresponding bit line is decreased. The bit-line potential is decreased sufficiently since the P-channel MOS transistors have a conductance greater than that of any other transistor incorporated in the device.

11 Claims, 5 Drawing Sheets

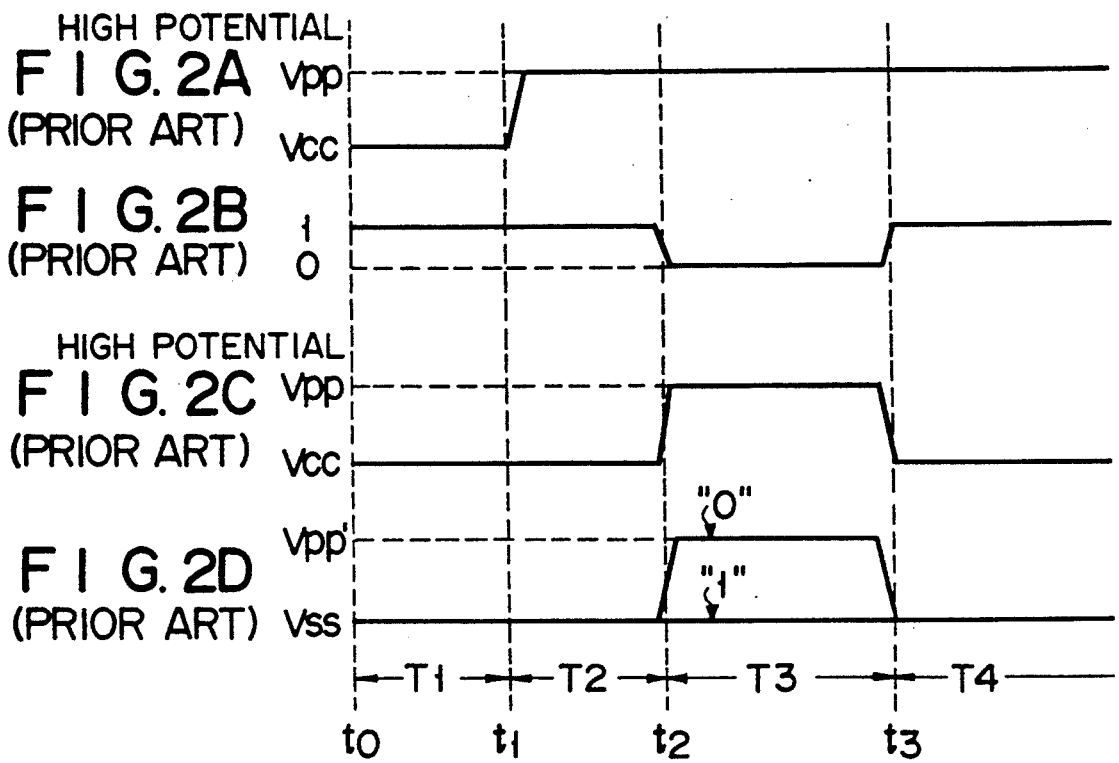
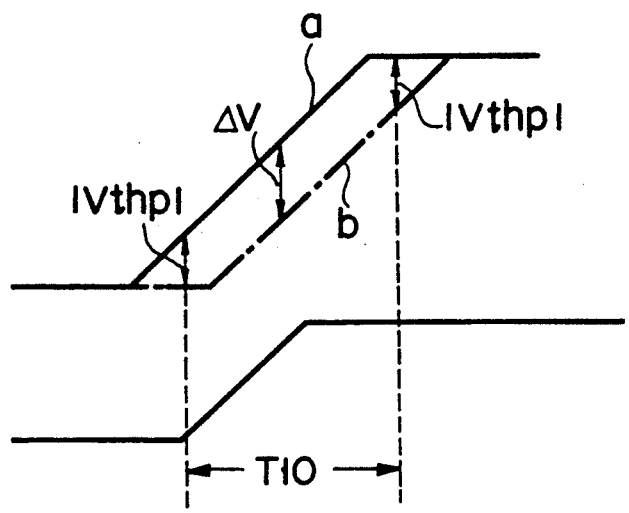

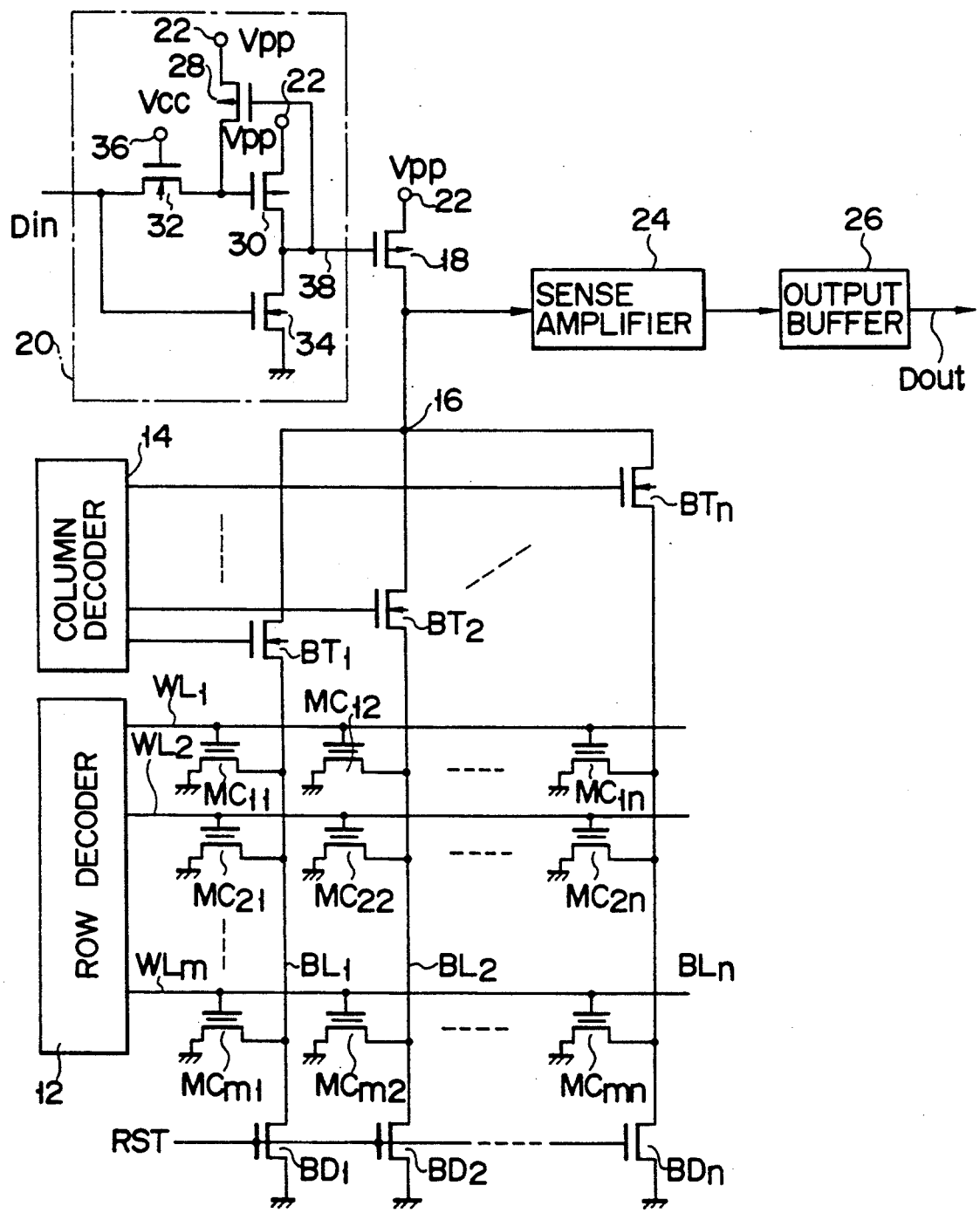
F I G. 4

F I G. 5A
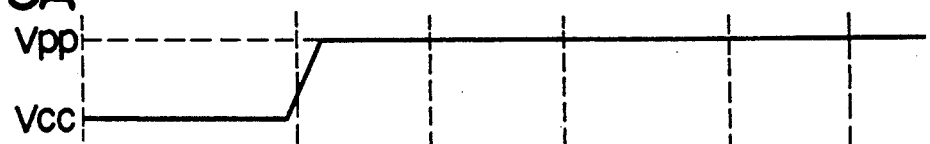
F I G. 5B
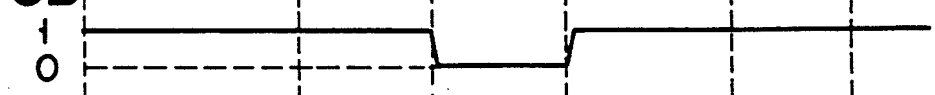
F I G. 5C
F I G. 5D
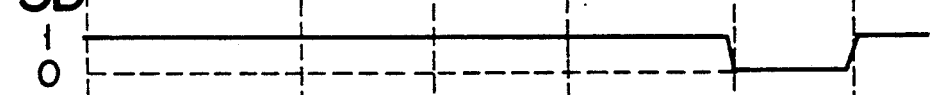
F I G. 5E
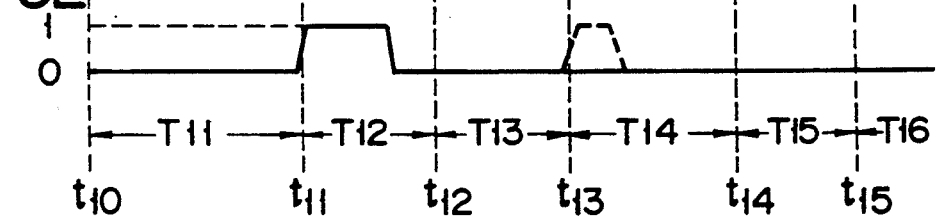
F I G. 6A
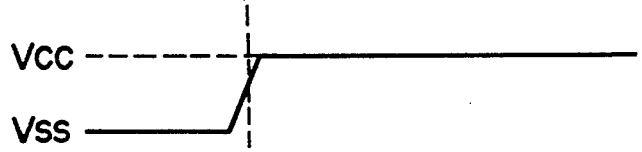
F I G. 6B
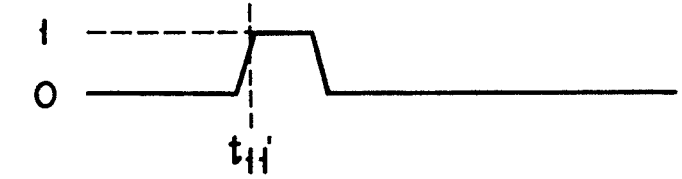

SEMICONDUCTOR NONVOLATILE MEMORY DEVICE FOR CONTROLLING THE POTENTIALS ON BIT LINES

This application is a continuation of application Ser. No. 409,307, filed Sept. 19, 1989, now abandoned.

BACKGROUND OF THE INVENTION

1. Field of the Invention

The present invention relates to a semiconductor nonvolatile memory device, and more particularly, to a semiconductor nonvolatile memory device containing memory cells each of the double gate structure in which potentials on the bit lines are controlled.

2. Description of the Related Art

There has been known an EPROM containing nonvolatile memory cells each of the double gate structure. FIG. 1 shows an arrangement of a part of a typical EPROM which uses transistors of the floating gate type as nonvolatile memory cells.

In the figure, $MC_{11}$, $MC_{12}$, ..., $MC_{1n}$,..., $MC_{mn}$ designate memory cells. The sources of those cells $MC_{11}$, $MC_{12}$, ..., $MC_{1n}$, ..., $MC_{mn}$ are all grounded. The gate electrodes of the memory cells $MC_{11}$, $MC_{12}$, ..., $MC_{1n}$ are connected to a word line $WL_1$; The gate electrodes of the memory cells $MC_{21}$, ..., $MC_{2n}$, to a word line $WL_2$; The gate electrodes of the memory cells $MC_{m1}$, ..., $MC_{mn}$, to a word line $WL_m$. These word lines $WL_l$ to $WL_m$ are coupled with a row decoder 12. The drains of the memory cells $MC_{11}$, ..., $MC_{ln}$, $MC_{12}$, ..., $MC_{m2}$, ..., $MC_{ln}$, ..., $MC_{ln}$..., $MC_{mn}$ are connected to bit lines $BL_l$ to $BL_n$, respectively. These bit lines $BL_l$ to $BL_n$ are connected to the drains of bit line select transistors of the P channel type $BT_l$ to $BT_n$. The gates of the transistors $BT_l$ to $BT_n$ are coupled with a column decoder 14. The sources of these transistors are connected together to a node 16.

The node 16 is coupled with the drain of a write select transistor 18. The gate electrode of the transistor 18 is coupled with a voltage shifter 20 and receives write data Din through the voltage shifter 20. The source of the transistor 18 is connected to a power source terminal 22. The node 16 is also connected to a sense amplifier 24. The amplifier 24 outputs data Dout through an output buffer 26.

The voltage shifter 20 is made up of P channel MOS transistors 28 and 30 and N channel MOS transistors 32 and 34, and these transistors are connected as shown. Reference numerals 22 and 36 are power source terminals. Power source voltage Vcc is applied to the terminal 36, and power voltage Vpp is applied to the terminal 22. In accordance with write data Din, that is inputted during a write period, the voltage shifter 20 produces at an output node 38 high potential Vpp or ground potential Vss.

In each of the memory cells $MC_{ll}$ to $MC_{mn}$, data is stored by utilizing a change of the threshold voltage, which is caused by injecting hot electrons into the floating gate. For example, a state of the memory cell when is injected with no electron corresponds to data "1"; a state of the cell when it is injected with electrons corresponds to data "0". To inject electrons, a high potential is simultaneously applied to the drain and the gate of the memory cell.

Let us consider a case that data is written into the memory cell $MC_{11}$. The word line $WL_1$ is selected by the row decoder 12, and its potential is set at a high potential for data write. The bit line select transistor $BT_1$ is made conductive by the output signal of the column decoder 14, to select the bit line $BL_1$. To write data "0", the transistor 18 is conductive, and a high potential of the power source voltage Vpp is applied from the power terminal 22 to the bit line $BL_1$, through write select transistor 18 and the bit line select transistor $BT_1$. Under this condition, the memory cell $MC_{11}$ is conductive to allow current to flow through the source-drain path. As a result, a voltage drops across the transistors 18 and $BT_1$, so that the potential on the bit line $BL_1$ becomes lower than the potential of Vpp. This potential, however, is much higher than the bit line potential when the memory device is in a read mode (This voltage will be denoted as Vpp').

Accordingly, the high potential is simultaneously applied to the gate and the drain in the memory cell $MC_{11}$. Under the high potential applied, hot electrons are generated in a portion closer to the drain in the channel region between the source and drain. Those electrons are injected into the floating gate. In this way, data "0" is written into the memory cell. To write data "1", the write select transistor 18 is made non-conductive. At this time, the high potential is not applied to the bit line $BL_1$. Accordingly, the high potential is applied to the memory cell $MC_{11}$ alone. Only the low potential is applied to the drain. Under this condition, no electron is injected into the floating gate, and data "1" is retained. Also in the case of data "0" writing, the memory cell whose drain and gate are simultaneously set at high potential is only the memory cell $MC_{11}$. In other words, no electron injection into the floating gate is performed in other memory cells. Accordingly, data is written into only the memory cell addressed.

Voltage Vpp applied to the terminal 22 is as low as power source voltage Vcc during the read period, but is much higher than voltage Vcc during the write period to write data into the memory cell. A change of the voltage at the terminal 22 is detected by a voltage detector (not shown), and the data write operation starts.

FIGS. 2A through 2D show a timing chart useful in explaining a data write operation in the EPROM shown in FIG. 1. In the charts, T1 between time points $t_0$ and $t_1$ indicates a normal read period. A write period lasts from time point $t_1$. In the write period, T3 between time points $t_2$ and $t_3$ indicates a write permission period. A write inhibit period is indicated by T2 between time points $t_1$ and $t_2$, and T4 lasting from time point $t_4$.

In the operation of the write mode, at time point $t_1$, the power source voltage Vpp level at the terminal 22 is changed from the low potential voltage Vcc level to the high potential voltage, as shown in FIG. 2A. After a predetermined time from the voltage change high potential Vpp (at time point $t_2$), a write control signal externally applied, such as a program signal $\overline{PGM}$ and a chip enable signal $\overline{CE}$, are set in "0" level during a preset period of time (T3), as shown in FIG. 2B. In synchronism with the write control signal, a potential on the word line is changed from potential Vcc to high potential Vpp at time $t_2$, as shown in FIG. 2C. At the same time, a potential on the bit line is set at the Vpp' potential or the Vss potential in accordance with the contents of data, "0" or "1", by the write select transistor 18, as shown in FIG. 2D.

It is assumed that the memory cell $MC_{11}$ is addressed in the EPROM of FIG. 1. During the write inhibit period T2 in FIGS. 2A through 2D, the voltage shifter 20 produces the high potential Vpp at the node 38.

During this period, the write select transistor 18 is made nonconductive, to prohibit the application of the high potential to the bit line BL₁.

Let us then consider a circuit operation of the EPROM when the voltage applied to the terminal 22 is changed from potential Vcc level to high potential, and the period T2 starts (at time t₁).

At the start of the period T2, the potential at node 38, like the potential at the terminal 22, will rise from potential Vc level to high potential level. The voltage shifter 20 is based on a feedback circuit, as shown in FIG. 1. Accordingly, the potential rise at the node 3 will possibly delay behind the potential rise at the power terminal 22. When the write data Din is set in "0" level, the N channel MOS transistor 34 is nonconductive and the P channel MOS transistor 30 is conductive. The node 38 is set at the potential Vcc of the terminal 22, through the transistor 30.

Under this condition, when the potential applied to the terminal 22 is changed from potential Vcc to potential Vpp, the node 38 is charged through the transistor 30 as indicated by a line "a" in FIG. 3A. Due to a time delay by a resistor component of the transistor 30 and a capacitor component associated with the node 38, an actual potential rise at the node 38 as indicated by a line "b" delays with respect to the potential rise represented by the line "a", as shown in FIG. 3A. When a potential difference ΔV existing between lines "a" and "b" becomes larger than an absolute value |Vthp| of the threshold voltage of the P channel MOS transistor, the write select transistor 18 is conductive. A conduction period of this transistor is denoted as T10 in FIG. 3B. During this period, the bit line BL₁ selected by the addressing is charged to the potential Vpp through the transistor 18. The conventional memory device is not provided with a path to allow the bit line BL₁ to be discharged when a potential difference between the potential at the terminal 22 and the potential at the node 38 becomes smaller than the absolute value |Vthp|, and the write select transistor 18 is nonconductive again. Therefore, in such a situation, the bit line BL1 is kept at the high potential for data write.

The column decoder 14 for generating a gate drive signal for the bit select line transistors BT₁ to BTₙ also employs a feedback arrangement (not shown) similar to that of the voltage shifter 20. Accordingly, the transistors BT₂ to BTₙ, which are coupled with the nonselect bit lines and should be nonconductive, will possibly be conductive for a short period of time, like the write select transistor 18. Thus, in the conventional memory device, all of the bit lines including the selected bit lines are charged to the high potential for data write.

Under this condition, however, data will never be written into the memory cell, because during the write inhibit period T2 shown in FIGS. 2A through 2D, the word line is at the potential Vcc. Afterwards, the write control signal drops to a "0" level, and the memory device enters the operation phase of the write permission period T3. As a result, the word line potential rises to the high potential Vpp. To write data "1", the transistor 18 is rendered nonconductive. Therefore, properly speaking, the bit line potential should not be at the high potential when the EPROM is in a write mode. Actually, however, for the above reason, where the bit line has been charged to the high potential, when the word line is at the high potential, there is the possibility that data "0" is written into the memory. Thus, the conventional semiconductor nonvolatile memory device inherently involves such problem that the data different from the correct data is written into the memory cell, viz., an incorrect write occurs.

SUMMARY OF THE INVENTION

Accordingly, an object of the present invention is to provide a semiconductor nonvolatile memory device capable of controlling the bit line potential, thereby to prevent the incorrect write.

According to an aspect of the present invention, there is provided a semiconductor nonvolatile memory device comprising: a power source terminal coupled for reception with a first power source voltage during a given read period and a second power source potential higher than the first power source during a given write period; a first MOS transistor of the P channel type having source, drain and gate electrodes, one of the source and drain being connected to the power source terminal, the first MOS transistor being conductive in responsive to the data write operation; at least one bit line connected at one end to the source or the drain of the first MOS transistor not connected to the power source terminal; at least one nonvolatile memory cell of the double gate structure having source, drain and gate electrodes, the source being coupled with a low potential and the drain being connected to the bit line; and at least one second MOS transistor of the N channel type having source, drain and gate electrodes, one of the source and drain being connected to the other end of the bit line, the source or the drain not connected to the other end of the bit line being connected to the low potential, when the second power source voltage is applied to at least the power source terminal, the second MOS transistor being rendered temporarily conductive.

BRIEF DESCRIPTION OF THE DRAWINGS

The aforementioned aspects and other features of the present invention are explained in the following description, the taken in connection with the accompanying drawings wherein:

FIGS. 2A through 2D form a timing chart useful in explaining a data write operation of the EPROM of FIG. 1, in which FIG. 2A shows a variation of a voltage at the power source terminal, FIG. 2B, a variation of a write control signal, FIG. 2C, a variation of a word line voltage, and FIG. 2D, a variation of a bit line voltage;

FIGS. 3A and 3B show waveforms of the voltage at the power source terminal and the bit line voltage, when a write select transistor in the EPROM is conductive;

FIG. 4 is a circuit diagram of an EPROM using transistors of the floating gate type as nonvolatile memory cells, which is an embodiment of the present invention;

FIGS. 5A through 5E form a timing chart useful in explaining a data write operation of the EPROM of FIG. 4, in which FIG. 5A shows a variation of a voltage at the power source terminal, FIG. 5B, a variation of a write control signal, FIG. 5C, a variation of a reset signal RSTI, FIG. 5D, a variation of an output enable signal, and FIG. 5E, a variation of a reset signal RST2;

FIGS. 6A and 6B show another timing chart useful in explaining the data write operation of the EPROM of FIG. 4, in which FIG. 6A shows a variation of a power source voltage and FIG. 6B shows a variation of a reset signal RST3.

DETAILED DESCRIPTION OF THE PREFERRED EMBODIMENT

Figure 1:
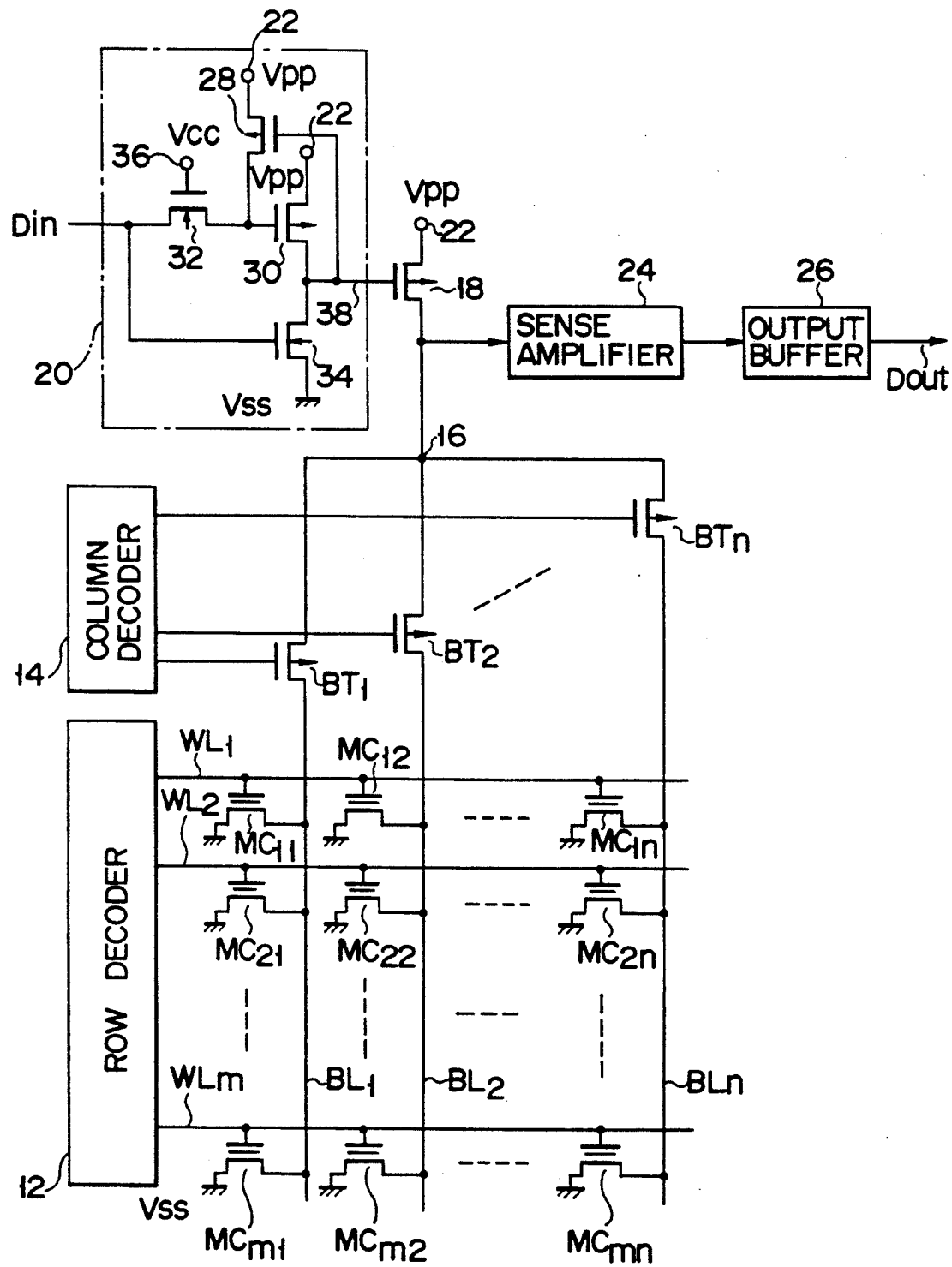
FIG. 1 is a circuit diagram of an EPROM of prior art which uses transistors of the floating gate type as nonvolatile memory cells.

A specific embodiment of a semiconductor nonvolatile memory device according to the present invention will be described with reference to the accompanying drawings.

Reference is first made to FIG. 4 showing an arrangement of an EPROM using nonvolatile transistors of the floating gate type as the memory cells, into which the present invention is incorporated.

In the figure, memory cells $MC_{11}$, $MC_{12}$,..., $MC_{ln}$, ..., $MC_{mn}$, each consisting of a floating gate type transistor, are arrayed in a matrix fashion. The sources of those transistors are grounded. The gates of the memory cells of "n" linearly arrayed in a row are coupled with one of "m" word lines $WL_l$ to $WL_m$, which are driven by output signals of a row decoder 12. The drains of the memory cells of "m" linearly arrayed in a column are coupled with one of "n" bit lines $BL_l$ to $BL_n$. Those bit lines $BL_l$ to $BL_n$ are also coupled with the drains of bit line select transistors $BT_l$ to $BT_n$ as P channel MOS transistors, which are driven by output signals of a column decoder 14. The sources of those transistors $BT_l$ to $BT_n$ are connected together to a node 16.

The node 16 is further connected to the drain of a write select transistor 18 as a P channel MOS transistor. The source of the transistor 18 is coupled with a power source terminal 22. During a read period, a power source voltage Vcc of low potential is applied to the terminal 22. During a write period, a power source voltage Vpp of high potential is applied to the terminal 22. The gate of the transistor 18 is coupled for reception with a signal from an output node 38 of a voltage shifter 20 of the feedback type.

The node 16 is coupled with a sense amplifier 24, which senses data in the form of a potential at the node 16 during a read period. The data sensed by the amplifier 24 is outputted as read data Dout, through an output buffer 26.

The voltage shifter 20 is made up of P channel MOS transistors 28 and 30 and N channel MOS transistors 32 and 34, and these transistors are connected as shown. Reference numerals 22 and 36 are power source terminals. During a read period, power source voltage Vcc at low potential is coupled with the terminal 36. In accordance with write data Din, that is inputted during a write period, the voltage shifter 20 produces at an output node 38 high potential Vpp or ground potential Vss. During a read period, power source voltage Vcc of low potential is coupled with the terminal 36. During a write period, power voltage Vpp of high potential is coupled with the terminal 22.

The reason why the feedback arrangement is employed for the voltage shifter 20 will be given below.

Where the high potential Vpp appears at the power source terminal 22, if write data Din is set in "1" level, a P channel MOS transistor 30 in the voltage shifter 20 will not be conductive. The reason for this is that the potential of the "1" level of the write data Din is lower than the low potential Vcc. When write data Din of "1" level is applied to the voltage shifter 20, an N channel MOS transistor 34 is conductive and the node 3 is set at the low potential. The low potential at the node 38 makes a P channel MOS transistor 28 conductive. Through the transistor 28, the Vpp potential is applied to the gate of the transistor 30, rendering the transistor 30 nonconductive. An N channel MOS transistor 32 in the voltage shifter 20 prohibits the Vpp potential at the gate of the transistor 30, when the gate is set at that potential, from transferring to the input terminal Din.

The ends of the bit lines $BL_l$ to $BL_n$, which are not coupled with the bit line select transistors $BT_l$ to $BT_n$, are coupled with the drains of bit line discharge transistors $BD_l$ to $BD_n$ as N channel MOS transistors. The sources of those transistors $BD_l$ to $BD_n$ are all grounded. The gates of them are coupled together to a circuit point coupled for reception with a reset signal RST.

Conductance (gm value) of each of the bit line than that of any of the transistor 18, and the bit line select transistors $BT_l$ to $BT_n$, which are serially interposed between the power source terminal 22 and the respective bit lines.

The EPROM as mentioned above employs only one stage of the bit line select transistors, for simplicity. Practically, two or more stages of those transistors, that are connected in series, are used in accordance with the number of bit lines. These stages of the transistors are arranged in an inversed V whose peak is positioned at the node 16. An EPROM configured on the plurality-of-bit basis contains the same number of the FIG. 4 circuit arrangements as that of the number of bits of simultaneous data read and write. In this case, the number of the decoders, the row decoder 12 and the column decoder 14, remains unchanged.

The operation of the EPROM thus arranged will be described with reference to FIGS. 5A through 5E showing a timing chart. In the figure, Tll between time points $t_{10}$ to $t_{11}$ designates a read period. Period $T_{12}$ and the subsequent ones constitute a write period. The write period consists of a write permission period T13 ($t_{12}$–$t_{13}$), write inhibition period T12 ($t_{11}$–$t_{12}$) and T14 ($t_{13}$–$t_{14}$), and write data verify period T15 ($t_{14}$–$t_{15}$). During the verify period T15, immediately after data is written into a memory cell, the written data i read out from the cell and it is verified with reference to the original data or data before written.

To write data into the memory cells, as in the prior art EPROM, the power voltage Vcc supplied to the output terminal 22 is changed from the low potential voltage Vcc to the high potential voltage Vpp.

After a predetermined time from the voltage change from the potential Vcc to the potential Vpp, a write control signal externally applied, such as a program signal $\overline{PGM}$ and a chip enable signal CE, are set in "0" level during a preset period of time. In synchronism with the write control signal, a potential on the word line is changed from potential Vcc to potential Vpp. At the same time, a potential on the bit line is set at the Vpp' potential or the Vss potential in accordance with the contents of data, "0" or "1".

It is assumed that the memory cell $MC_{11}$ is addressed in the EPROM of FIG. 4, and that the potential at the terminal 22 is changed from potential Vcc to potential Vpp at time $t_{11}$, as shown in FIG. 5A. The circuit operation of the EPROM when the write inhibit period T12 starts will be described with reference to FIGS. 5A through 5E.

At the start of the period T12, there is the possibility that where "0" write data Din is supplied, the bit lines $BL_l$ to $BL_n$ are charged through the transistor 18 to the high potential Vpp, as already mentioned. In this instance, however, when the the potential at the terminal 22 is changed, and supply of the high potential Vpp starts, a reset signal RST applied to the common gate of the bit line discharge transistors $BD_l$ to $BD_n$ is temporarily set in a "1" level. This pulse signal is denoted as RST1 in FIG. 5C. The "1" duration of the reset signal RST1 is substantially equal to the period T12. With the reset signal of a "1" level, the transistors $BD_l$ to $BD_n$ are all conductive, and the bit lines $BL_l$ to $BL_n$ charged up to the high potential Vpp are discharged through those transistors to ground.

At the instant that the write permission period T13 where the write control signal drops to a "0" level, starts, the reset signal RSTI drops to a "0" level, as shown in FIG. 5B. In turn, the transistors $BD_l$ to $BD_n$ becomes all nonconductive. Therefore, even when the word line potential is high, the incorrect data "0" will never be written into the memory cell into which no data needs to be stored.

During the period T13, the potential at the output node 38 of the voltage shifter 20 of a bit coupled for reception with data Din of "1" level, becomes "0" level (Vss). In turn, the write select transistor 18 of this bit is conductive, and the potential at the node 16 becomes high. Accordingly, in this bit, the correct "0" data is written.

The reset signal RST1 shown in FIG. 5C rises to a "1" level also during the subsequent period T14. The reason for this is that during the verify period T15, to read the data once written from the memory cell, the bit line must be set at the low potential for data read by the sense amplifier 24. Also during the period T14, the transistors $BD_l$ to $BD_n$ are all conductive to ground the bit lines $BL_l$ to $BL_n$. Afterwards, the bit line selected by the addressing is set at the low potential for data read by a load circuit (not shown) provided in the sense amplifier 24. The verify period T15 starts when an output enable signal $\overline{OE}$ externally applied is decreased to a "0" level (FIG. 5D).

The reset signal RSTI in FIG. 5C may be replaced by a reset signal RST2 as shown in FIG. 5E, if required. The "1" level duration of the signal RST2 is shorter than the period between time points $t_{11}$ and $t_{12}$. At time $t_{11}$, the potential at the terminal 22 is changed from potential Vcc to potential Vpp. At time $t_{12}$, the write permission period T13 starts Allowing for the verify operation during the verify period T15, the reset signal RST2 shown in FIG. 5E may be shaped to rise again in waveform for a given period of time in the first half of the write inhibit period T13, which precedes to the verify period, as shown in FIG. 5E.

In a situation that the low potential power source voltage Vcc is externally applied and at the same time the write high potential power source voltage Vpp is applied to the power source terminal 22, the operation as shown in FIGS. 6A and 6B is performed. As shown in FIG. 6A, the voltage Vcc rises at time $t_{11}'$. In synchronism with the rise of the voltage Vcc, a reset signal RST3 rises to a "1" level and this state is continued for a given period. The voltage Vcc and the reset signal RST3 may be related in this way.

Figure 7:
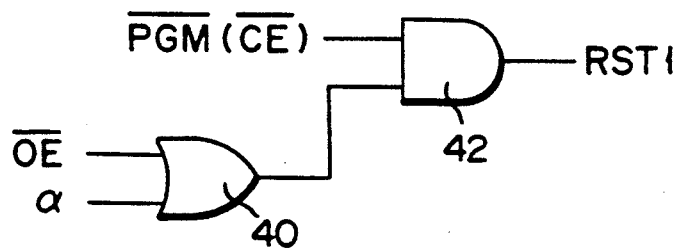
FIGS. 7, 8 and 9 show arrangements of a circuit for supplying the reset signals RST1 to RST3 supplied to a bit line discharge transistor in the EPROM of FIG. 4.

The reset signal RST1 shown in FIG. 5C may be generated by a logic arrangement as shown in FIG. 7. FIG. 7 shows a basic reset signal generating circuit for generating the reset signal RST1. Signal c is a signal which remains at the high level when the Vpp terminal is at the high potential for writing data, not at power source voltage Vcc. Signal $\alpha$ and the output enable signal $\overline{OE}$ are input to the OR gate 40. The output of the OR gate 40 and the write control signal ($\overline{PGM}$ or $\overline{CE}$) are input to the AND gate 42. The output of this AND gate 42 is used as reset signal RST1.

The logic circuit described above can produce an output which is at the "1" level at all times, except for the period (T13 in FIG. 5B) during which power source voltage Vpp is at the high level so that data can be written into the memory cell. The logic circuit thus arranged can produce a reset signal RST1 as shown in FIG. 5C.

Figure 8:
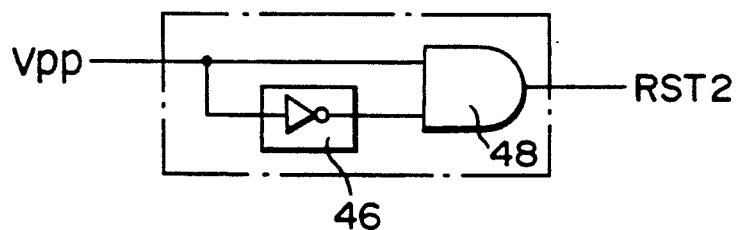

A circuit arrangement shown in FIG. 8 may be used for generating the reset signal RST2 shown in FIG. 5E. The circuit, like the ordinary address transition detector, detects a potential rise to the power voltage Vpp. As shown, to obtain a desired reset signal RST2, the voltage Vpp is applied directly to one of the input terminals of an AND gate 48, and through to the other input thereof.

Figure 9:
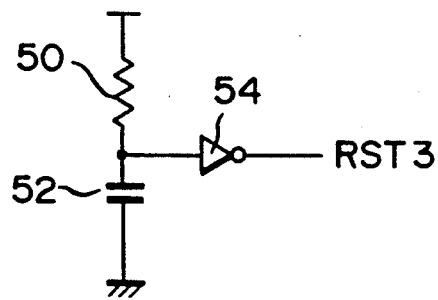

The reset signal RST3 shown in FIG. 6B may be generated by using a circuit to detect a potential rise to the voltage Vpp, viz., a called power-on circuit. Such a circuit may be realized by interconnecting a resistor 50, a capacitor 52 and an inverter 54 shown in FIG. 9.

In many EPROMs, verify reset transistors are coupled with the bit lines and through these transistors, the bit lines are discharged when the operation mode of the EPROM shifts from the write mode (period T13) to the verify mode (period T15). Accordingly, the bit line discharge transistors $BD_l$ to $BD_n$ in the EPROM of FIG. 4 may be replaced by the verify reset transistors. Where the verify reset transistors are used for the transistors $BD_l$ to $BD_n$, the reset signals RST1 to RST3 are applied through an OR gate to the gates of the verify reset transistors.

As seen from the foregoing description, the semiconductor nonvolatile memory device according to the present invention is arranged such that when the supply of a power source voltage of the high potential applied to the power source terminal starts, the N channel MOS transistor inserted between the bit lines and the low potential is made temporarily conductive to discharge the bit lines to the low potential. Therefore, the incorrect data will not be written mistakenly.

Incidentally, when the verify reset transistors are used in place of the bit line discharge transistors $BD_l$ to $BD_n$, thet conductance of each of those transistors must be satisfactorily larger than that of any of the transistors for write select and the bit line select.

What is claimed is:

1. A semiconductor nonvolatile memory device comprising:
   a power source terminal coupled for reception to a first power source voltage during a given read period and coupled for reception to a second power source voltage higher than said first power source voltage during a data write period;
   means for inputting data during the data write period;
   a first MOS transistor of the P channel type having source, drain and gate electrodes, one of said source and drain electrode being connected to said power source terminal, said first MOS transistor being conductive in response to input data while said second power source voltage is connected to said power source terminal;

at least one bit line having first and second ends connected at said first end to another one of said source or said drain electrode of said first MOS transistor;

at least one nonvolatile memory cell of double gate structure having source, drain and gate electrodes, said source electrode being coupled to a low potential and said drain electrode being connected to said bit line intermediate the first and second ends; and at least one second MOS transistor of the N channel type having source, drain and gate electrodes, one of said source and drain electrodes being connected to said second end of said bit line, another one of said source sand said drain electrodes being connected to said low potential;

means, connected to the gate electrode of said second MOS transistor, for rendering said second MOS transistor nonconductive for a first period of time, conductive for at least a portion of a second period of time, and nonconductive for a third period of time, said first period of time ending and said second period of time beginning in response to said second power sourced voltage being coupled to said power source terminal and said second period of time ending and said third period of time beginning in response to a write control signal being activated.

2. A device according to claim 1, wherein conductance of said second MOS transistor is larger than that of any other MOS transistor in the semiconductor nonvolatile memory including said first MOS transistor.

3. A device according to claim 2, further comprising a reset signal supplying means for supplying a reset signal to control the conduction of said second MOS transistor to the gate of said second MOS transistor.

4. A device according to claim 3, wherein said bit lines and said second MOS transistor respectively consist of at least two bit lines and at least two MOS transistors, and further comprising at least two bit line select transistors each having source, drain and gate electrodes, one of said source and said gate being connected to said first MOS transistor, while said source or said gate not connecting to said first MOS transistor being connected to said low potential.

5. A device according to claim 4, wherein each of said bit line select transistors comprises a P channel MOS transistor.

6. A device according to claim 3, wherein said inputting means further comprises a power change means for controlling the inputting of data for data write, said power change means being coupled to the gate electrode of said first MOS transistor.

7. A device according to claim 6, wherein said power change means includes a voltage shifter of the feedback type.

8. A device according to claim 3, wherein said nonvolatile memory cells each comprises a floating gate transistor.

9. A device according to claim 4, further comprising a column coding means for selecting said bit lines, said column coding means being coupled with said bit line select transistors.

10. A device according to claim 4, further comprising a row decoding means for selecting one of word lines coupled with said nonvolatile memory cells.

11. A semiconductor nonvolatile memory device according to claim 1, wherein said rendering means includes means for rendering said second MOS transistor conductive for at least a portion of a fourth period of time, said fourth period of time beginning and said third period of time ending in response to said write control signal being deactivated.

* * * * *